United States Patent
Jun et al.

(10) Patent No.: US 6,965,161 B2
(45) Date of Patent: Nov. 15, 2005

(54) CERAMIC MULTILAYER SUBSTRATE AND METHOD FOR MANUFACTURING THE SAME

(75) Inventors: Seok Taek Jun, Kyungki-do (KR); Young Keun Lee, Kyungki-do (KR); Ik Seo Choi, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 210 days.

(21) Appl. No.: 10/340,590

(22) Filed: Jan. 13, 2003

(65) Prior Publication Data

US 2004/0094834 A1 May 20, 2004

(30) Foreign Application Priority Data

Nov. 19, 2002 (KR) ................................ 10-2002-0072026

(51) Int. Cl.$^7$ ............................................. H01L 23/12
(52) U.S. Cl. ........................ 257/700; 257/700; 257/698
(58) Field of Search ................................ 257/700, 701, 257/686, 767; 29/852, 612; 338/23; 176/262

(56) References Cited

U.S. PATENT DOCUMENTS 6,041,496 A * 3/2000 Haq et al. ..................... 29/852
6,311,390 B1 * 11/2001 Abe et al. ..................... 29/612
2002/0064029 A1 * 5/2002 Pohjonen ..................... 361/719
2003/0128096 A1 * 7/2003 Mazzochette ............. 338/22 R

FOREIGN PATENT DOCUMENTS

| JP | 02-166792 | 6/1990 |
| JP | 5-327222 | 12/1993 |
| JP | 08-037251 | 2/1996 |

* cited by examiner

*Primary Examiner*—David Nelms
*Assistant Examiner*—Thinh T Nguyen
(74) *Attorney, Agent, or Firm*—Lowe, Hauptman, Gilman & Berner, LLP

(57) ABSTRACT

A ceramic multilayer substrate is formed by vertically stacking and firing a plurality of ceramic sheets, in which a connection bar is vertically formed between internal patterns and an external terminal of each ceramic sheet, preventing metallic conductive layers of the internal patterns from being deformed during processing the external terminal. The ceramic multilayer substrate has pattern layers formed on surfaces of at least some of the ceramic sheets. At least one through hole is formed on the edges of the stacked ceramic sheets so as to be opened to the outside. An external terminal is formed on an inner wall of the through hole connected with the pattern layers, and directly contacting the connection bar, whereby the connection bar supports the electrical connection between the external terminal and the pattern layers.

21 Claims, 15 Drawing Sheets

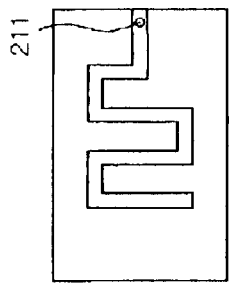
FIG. 12a
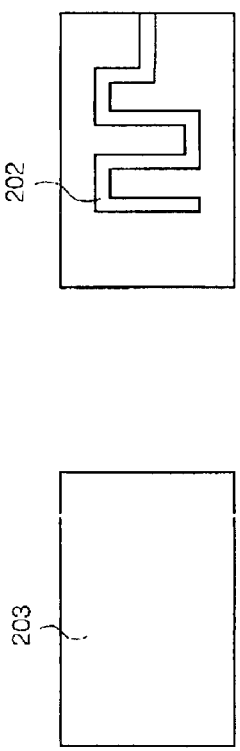
FIG. 12b
FIG. 12c
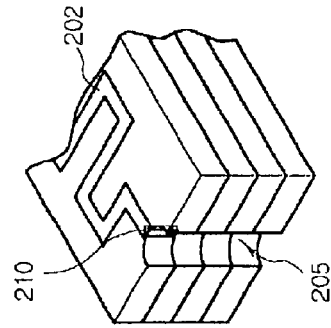
FIG. 12d
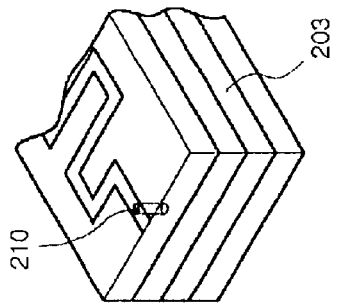
FIG. 12e
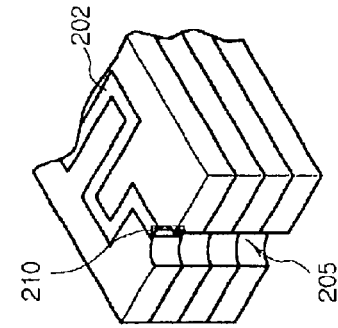
FIG. 12f
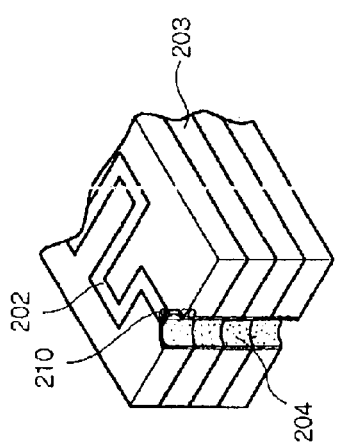
FIG. 12g

CERAMIC MULTILAYER SUBSTRATE AND METHOD FOR MANUFACTURING THE SAME

BACKGROUND OF THE INVENTION

1. Field of the Invention

The present invention relates to a ceramic multilayer substrate with an improved connection structure between internal patterns and an external terminal, and a method for manufacturing the substrate, and more particularly to a low temperature co-fired ceramic multilayer substrate formed by vertically stacking and firing a plurality of ceramic sheets or layers, in which a connection bar is vertically formed on connection areas between internal patterns and an external terminal of each ceramic sheet, thereby preventing metallic conductive layers of the internal patterns from being deformed during the formation of the external terminal and stably connecting the internal patterns to the external terminal, and a method for manufacturing the substrate.

2. Description of the Related Art

A technique for manufacturing a low temperature co-fired ceramic (hereinafter, being referred to as "LTCC") substrate is a process in which an internal electrode and passive elements (R, L, and C) for given circuits are formed on a green sheet made of glass ceramic by a screen printing method using a metal with high electric conductivity such as Ag, Cu, or etc and a plurality of the green sheets are stacked vertically and then fired (generally at less than 1,000° C.) so as to manufacture MCM (multi-chip modules) and multi-chip packages.

Since the ceramic substrate and the metallic elements are co-fired, the LTCC technique can form the passive elements (R, L, and C) within a module, thereby obtaining a complex configuration including many components and being advantageous in terms of miniaturization.

Since the LTCC substrate comprises the embedded passive elements, the LTCC substrate can be formed as a SOP (System-On-Package), thereby minimizing a parasitic effect generated in parts of a SMD (Surface Mounted Device). Further, the LTCC substrate reduces electrical noise generated at soldering parts in surface mounting, thereby improving electrical characteristics of the manufactured device, and reduces soldering, thereby improving the reliability of the manufactured device. Moreover, the LTCC substrate minimizes a temperature coefficient of resonant frequency (Tf) by adjusting a thermal expansion coefficient, thereby controlling characteristics of a dielectric resonator.

The LTCC multilayer substrate is formed by forming circuits in a single ceramic substrate and vertically stacking a plurality of the ceramic substrates. Therefore, external terminals to be connected to the outside must be formed on an outer surface of the LTCC substrate and electrically connected to circuit patterns within the substrate.

FIGS. 1 and 2 show "a stack electronic component", in which a laminated substrate having internal circuits is provided, via holes are vertically formed through the substrate, and external electrodes are formed by filling the via holes with a conductor, as disclosed by Japanese Patent Laid-open Publication No. Hei8-37251. As shown in FIGS. 1 and 2, via holes 7 are formed through a stack structure 5 and filled with conductors 9, and the conductors 9 within the via holes 7 are connected to the internal circuits. Then, through holes 10 are formed through the stack structure 5 and the conductors 9 are exposed to the through holes 10.

The exposed conductors 9 serve as external electrodes 4 for electronic components. In this Japanese Publication, since the conductors 9 formed in the via holes 7 become the external electrodes 4, the external electrodes 4 have uniform dimensions and shapes and are easily formed.

However, the above Japanese Publication has a problem as follows.

The rectangular via holes 7 are simultaneously formed vertically through plural stacked green sheets by a punching method or etc. In this case, as shown in FIG. 3, the stacked green sheets are compressed in a direction of the punching by shear stress, and the internal metal patterns on the green sheets are not exposed in the via holes 7. The internal patterns must be exposed in the via holes 7 so as to be connected to the conductors 9 formed in the via holes 7 for serving as the external electrodes. However, the Japanese Publication as shown in FIGS. 1 and 2 does not solve the above-described problem.

There are various methods for forming external electrodes in the conventional low temperature co-fired ceramic multilayer substrate. First, as shown in FIG. 4, an internal pattern 2a is extended to a side of each ceramic sheet and exposed to the outside. Then, the ceramic multilayer substrate 3 is formed by stacking and firing the plural ceramic sheets at a high temperature.

An external electrode 4a is formed on an side surface of the ceramic multilayer substrate 3 by deposition without forming any through hole in the ceramic multilayer substrate 3 by the punching method. This method assures connection between the internal patterns and the external electrode. However, after the ceramic multilayer structure is cut into a plurality of unit ceramic multilayer substrates 3, the surface of the ceramic multilayer substrate 3 is ground so as to expose the internal patterns 2a prior to forming the external electrode 4a. Therefore, this method complicates a manufacturing process of the substrate and does not satisfy a requirement for mass production.

Further, FIG. 5 illustrates a further method for forming external electrodes. Herein, a notch being quarter-circular in shape is formed at a corner of each ceramic substrate so as to expose an internal pattern 2b, and an external electrode 4b is formed in each notch. Then, the ceramic multilayer substrate 3 is formed by stacking a plurality of the ceramic substrates, thereby integrating the external electrodes 4b into one external terminal. In this case, since the external electrodes 4b must be respectively formed on the ceramic substrates, the manufacturing process is very complicated. Further, since the dimensions of all the substrates are not uniform due to the difference of contraction ratios between individual substrates, the ceramic multilayer substrate is easily damaged by an external impact, or etc.

Moreover, FIG. 6 illustrates another method for forming external electrodes. Herein, a notch being quarter-circular in shape is formed at a corner of each sheet so as to expose an internal pattern 2c. Then, the ceramic multilayer substrate 3 is formed by stacking a plurality of ceramic sheets, and external electrodes 4c are simultaneously formed in the plural notches by the deposition. This method is generally used in forming external electrodes on a conventional low temperature co-fired ceramic multilayer substrate. As shown in FIG. 6, since the notches of the ceramic multilayer substrate 3 are not precisely aligned with each other, a material for forming the external electrodes is not uniformly deposited in every notch and the connection between the internal patterns and the external electrode becomes poor.

FIG. 7 illustrates yet another method for forming external electrodes, being similar to the method disclosed by Japanese Patent Laid-open Publication No. Hei8-37251. First, a plurality of ceramic green sheets are stacked vertically so as to form the ceramic multilayer substrate 3. Then, a notch is formed at a corner of the ceramic multilayer substrate 3 and an external electrode 4d is formed in the notch by the deposition. In this case, as described in FIG. 3, internal patterns 2d are not exposed in the notch in a step for forming the notch, thereby causing the same problem of not being connected to the external electrode 4d.

Therefore, there is required in the art a method for simultaneously forming through holes on every sheet of a ceramic multilayer substrate by a punching method so as to simplify a manufacturing process of the ceramic multilayer substrate and improve the connection between the internal patterns and the external electrode.

SUMMARY OF THE INVENTION

Therefore, the present invention has been made in view of the above problems, and it is an object of the present invention to provide a ceramic multilayer substrate for maintaining a connection between internal patterns and an external electrode where a plurality of ceramic green sheets provided with internal patterns are stacked vertically and a through hole is formed in an area of the external terminal of the ceramic multilayer substrate, and a method for manufacturing the substrate.

It is another object of the present invention to provide a ceramic multilayer substrate in which a plurality of ceramic green sheets are stacked vertically and a through hole is formed in the ceramic multilayer substrate so as to form an external terminal therein, thereby simplifying a manufacturing process of the multilayer substrate and improving quality of the multilayer substrate, and a method for manufacturing the substrate.

In accordance with one aspect of the present invention, the above and other objects can be accomplished by the provision of a ceramic multilayer substrate formed by stacking and firing a plurality of ceramic sheets, comprising: pattern layers formed on surfaces of at least one of the ceramic sheets to form designated circuit elements; at least one through hole being formed on edges of the stacked ceramic sheets to be opened to the outside; at least one connection bar vertically formed in the ceramic sheet or sheets having the pattern layers, the connection bar contacting the pattern layers and being exposed by the through hole; and at least one external terminal formed on the inner wall of the through hole, connected with the pattern layers, and directly contacting the connection bar, whereby the connection bar supports the electrical connection between the external terminal and the pattern layers.

In accordance with a further aspect of the present invention, there is provided a method for manufacturing a multilayer substrate by stacking and firing a plurality of ceramic sheets, comprising the steps of: preparing a plurality of ceramic sheets, each of the ceramic sheets having a designated thickness; forming pattern layers on surfaces of at least one of the ceramic sheets so as to form circuit elements; forming via holes vertically in the ceramic sheets within a part of the pattern layers extended to edges of the ceramic sheets adjacent to the edges so as to exchange signals with the outside; forming connection bars by filling the via holes with a material being electrically connected to the pattern layers; stacking the ceramic sheets; forming at least one through hole vertically on the edges of the stacked ceramic substrates so as to expose the connection bars to the outside; and forming at least one external terminal in said through hole by deposition.

In accordance with another aspect of the present invention, there is provided a method for manufacturing a multilayer substrate by stacking and firing a plurality of ceramic sheets, comprising the steps of: preparing a plurality of ceramic sheets, each of the ceramic sheets having a designated thickness; forming via holes vertically in the ceramic sheets adjacent to edges of the ceramic sheets; forming connection bars by filling the via holes with a conductive material; forming pattern layers on surfaces of at least one of the ceramic sheets so as to form circuit elements such that the connection bars are located within a part of the pattern layers extended to the edges of the ceramic substrates so as to exchange signals with the outside; stacking the ceramic sheets; forming at least one through hole vertically on the edges of the stacked ceramic sheets so as to expose the connection bars to the outside; and forming at least one external terminal in said through hole by deposition.

In accordance with still another aspect of the present invention, there is provided a method for manufacturing multilayer substrates by stacking and firing a plurality of ceramic sheets, comprising the steps of: preparing a plurality of bulk ceramic sheets, each being provided with scribe lines so as to be cut into a plurality of ceramic substrates and having a designated thickness; forming a plurality of same pattern layers on surfaces of the bulk ceramic sheets so as to form circuit elements; forming via holes vertically in the ceramic sheets within a part of the pattern layers extended to the scribe lines of the ceramic sheets adjacent to the scribe lines so as to exchange signals with the outside; forming connection bars by filling the via holes with a material being electrically connected to the pattern layers; stacking the ceramic sheets; forming through holes vertically on the scribe lines of the stacked ceramic substrates so as to expose the connection bars to the outside; forming external terminals in the through holes by deposition; and cutting the stacked ceramic sheets along the scribe lines into a plurality of unit ceramic multilayer substrates.

In accordance with yet another aspect of the present invention, there is provided a method for manufacturing multilayer substrates by stacking and firing a plurality of ceramic sheets, comprising the steps of: preparing a plurality of bulk ceramic sheets, each being provided with scribe lines so as to be cut into a plurality of ceramic substrates and having a designated thickness; forming via holes vertically in the ceramic sheets adjacent to the scribe lines; forming connection bars by filling the via holes with conductive material; forming a plurality of same pattern layers on surfaces of the ceramic sheets so as to form circuit elements such that the connection bars are located within a part of the pattern layers extended to the scribe lines of the ceramic sheets so as to exchange signals with the outside; stacking the ceramic sheets; forming through holes vertically on the scribe lines of the stacked ceramic sheets so as to expose the connection bars to the outside; forming external terminals in the through holes by deposition; and cutting the stacked ceramic sheets along the scribe lines into a plurality of unit ceramic multilayer substrates.

A stack structure in accordance with the present invention is formed by stacking a plurality of layers, thereby producing a package. The layers are properly selected from materials having electric, dielectric and magnetic characteristics. Particularly, each layer is made of a ceramic green sheet with a designated thickness. A pattern layer is formed in a designated shape on each green sheet by depositing a metal thereon, and serves as a circuit element when the green sheets are stacked. The pattern layer is made of metal such as Ag, Cu, or etc. The plural ceramic sheets are stacked and fired at a low temperature, thereby forming a stack structure referred to as a "low temperature co-fired ceramic multilayer substrate".

BRIEF DESCRIPTION OF THE DRAWINGS

The above and other objects, features and other advantages of the present invention will be more clearly understood from the following detailed description taken in conjunction with the accompanying drawings, in which:

FIGS. 12A to 12G show a method for manufacturing a ceramic multilayer substrate in accordance with a first embodiment of the present invention;

DESCRIPTION OF THE PREFERRED EMBODIMENTS

Figure 1:
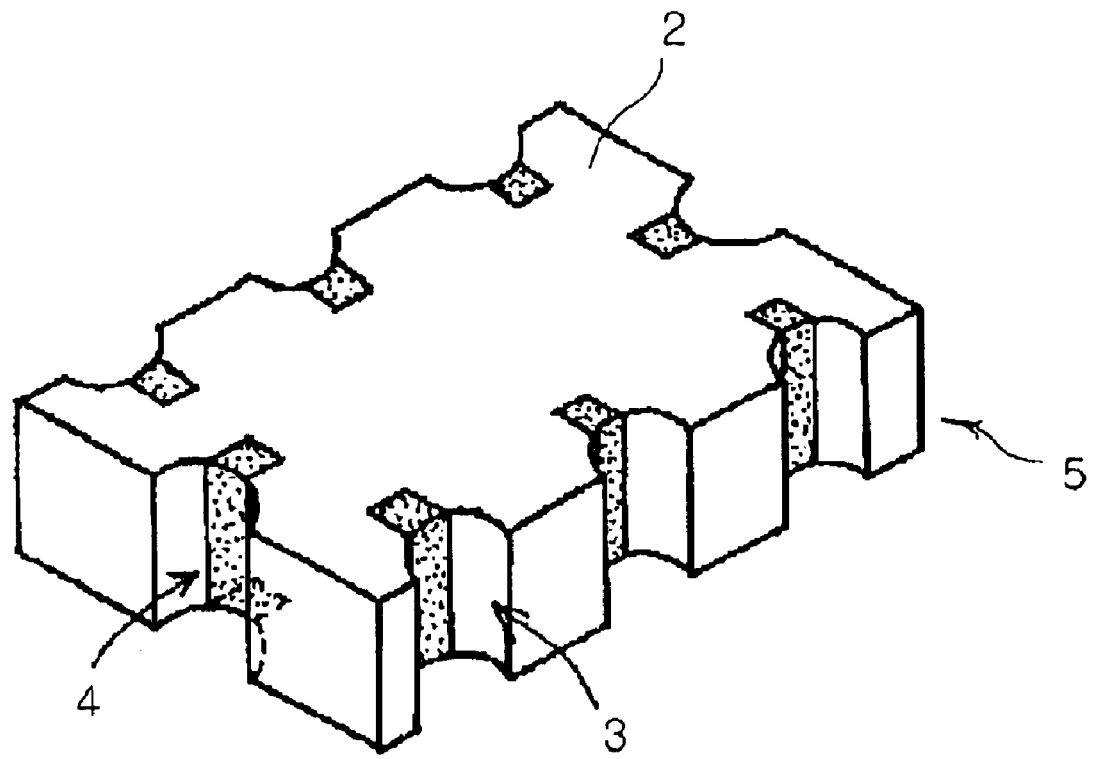
FIG. 1 is a perspective view of a conventional multilayer substrate after the cutting so that external terminals are exposed to the outside.
Figure 2:
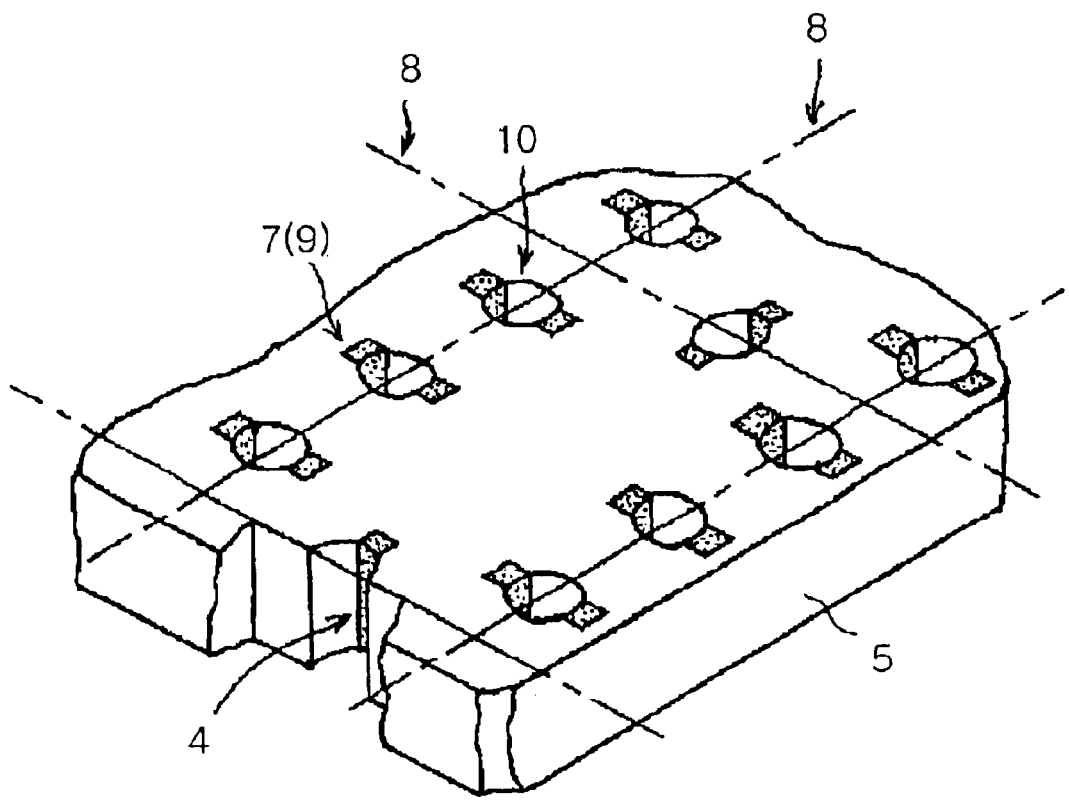
FIG. 2 is a perspective view of the conventional multilayer substrate of FIG. 1 prior to the cutting.
Figure 3:
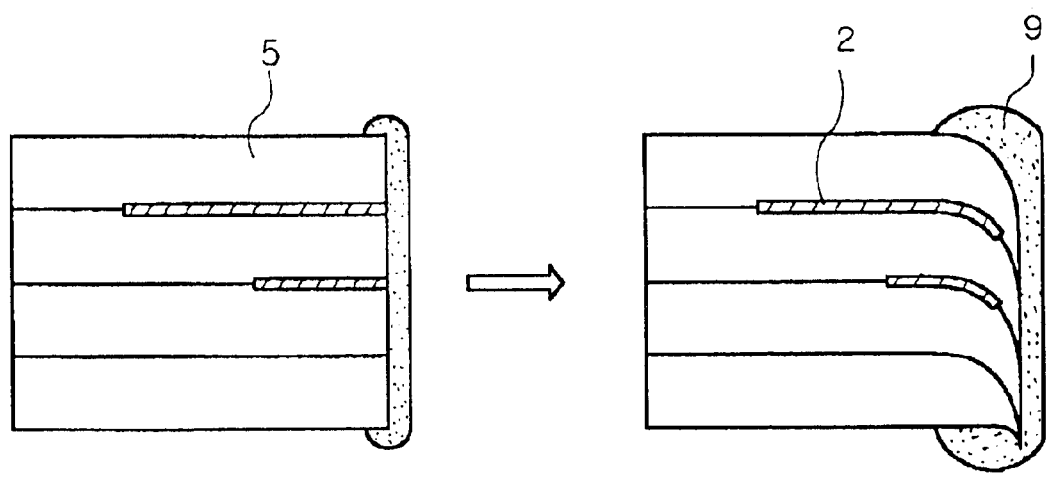
FIG. 3 is a schematic view illustrating problems generated in forming the multilayer substrate of FIG. 1.
Figure 4:
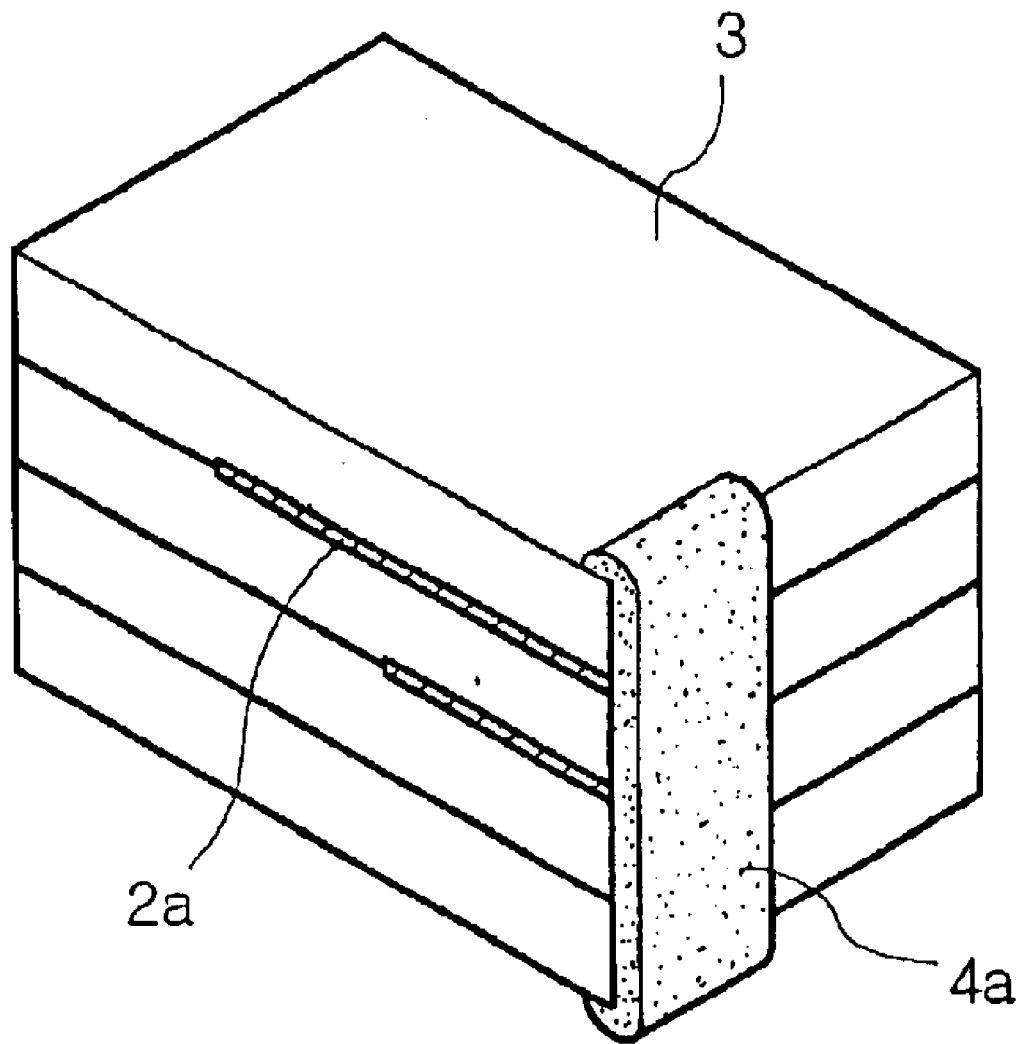
FIG. 4 is a perspective view of showing a multilayer substrate comprising an external terminal formed by a conventional method.
Figure 5:
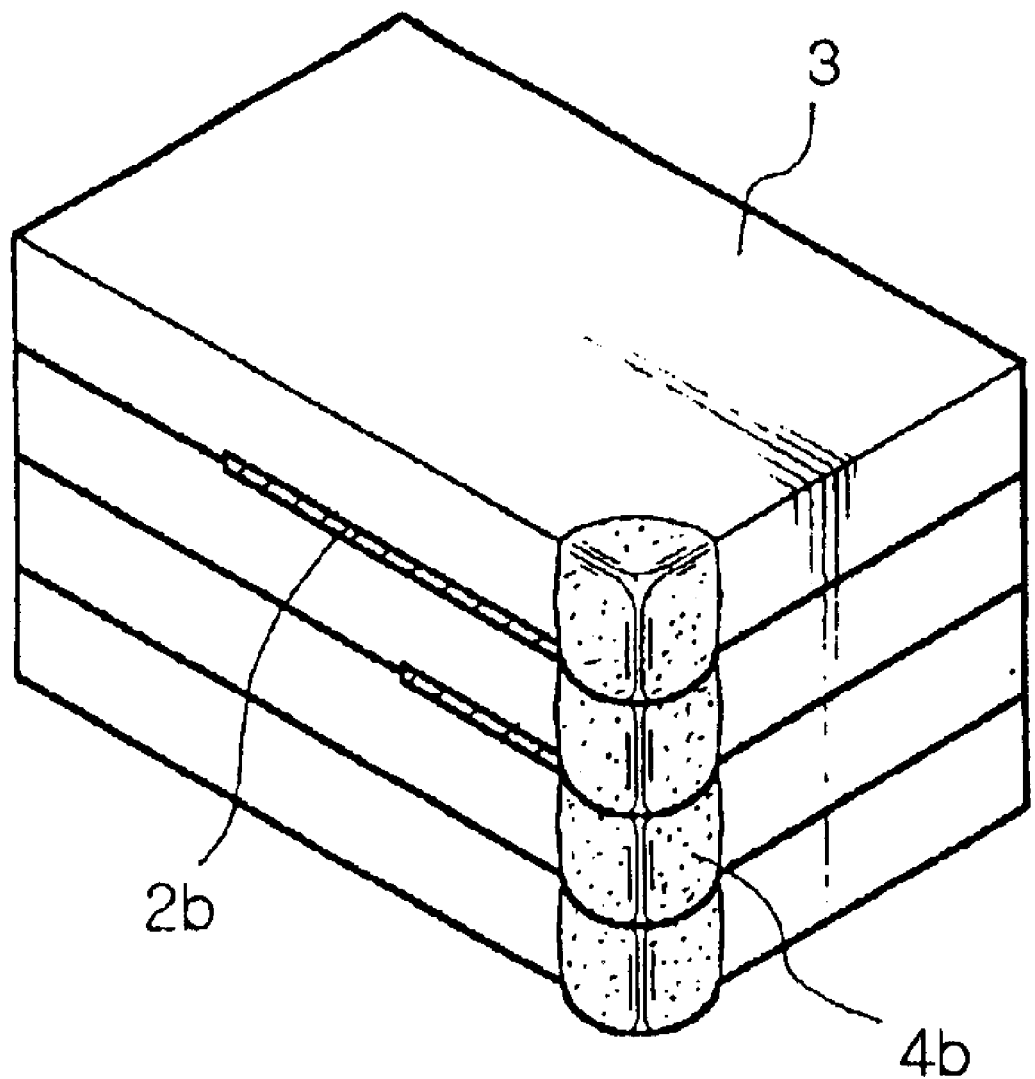
FIG. 5 is a perspective view showing a multilayer substrate comprising an external terminal formed by a further conventional method.
Figure 6:
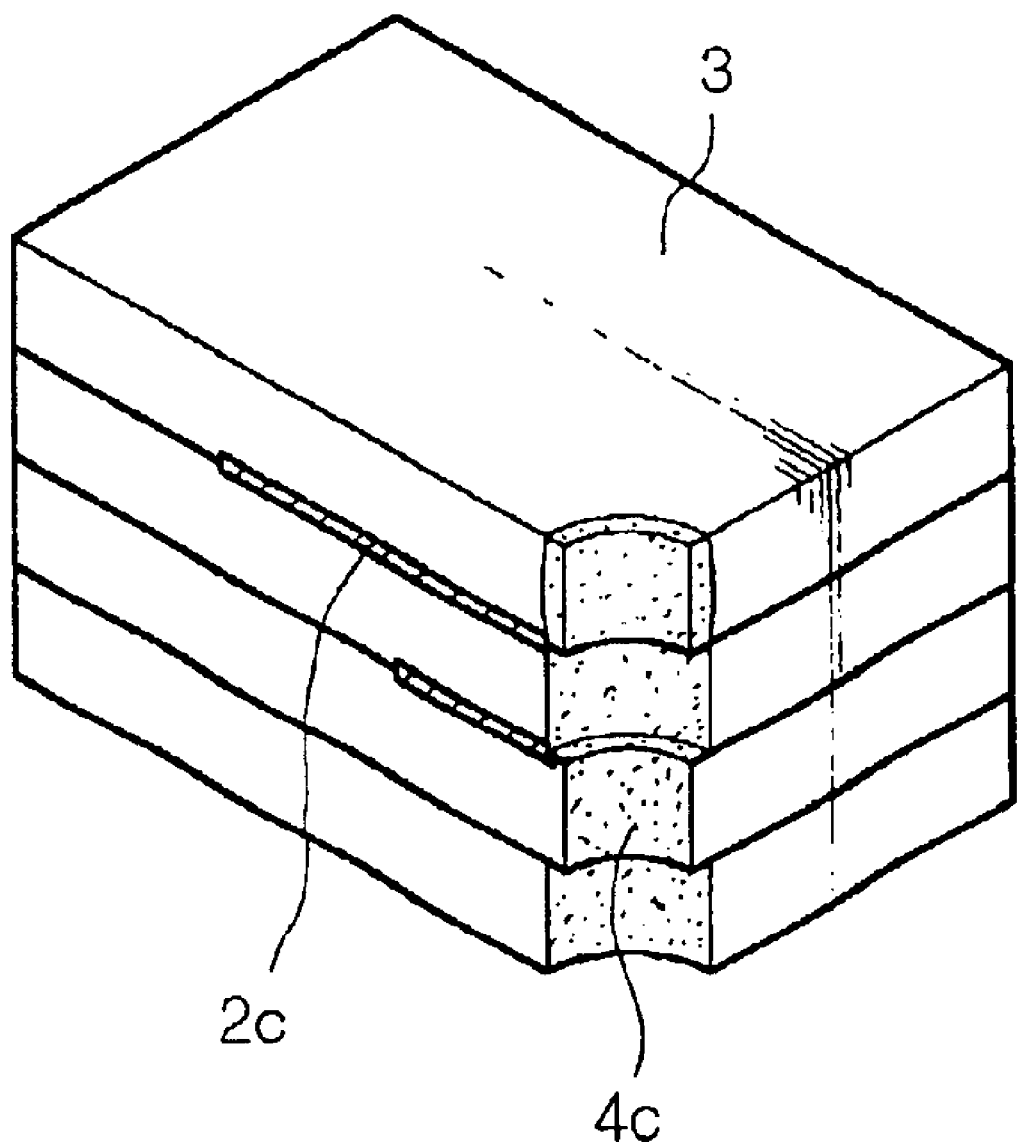
FIG. 6 is a perspective view showing a multilayer substrate comprising an external terminal formed by another conventional method.
Figure 7:
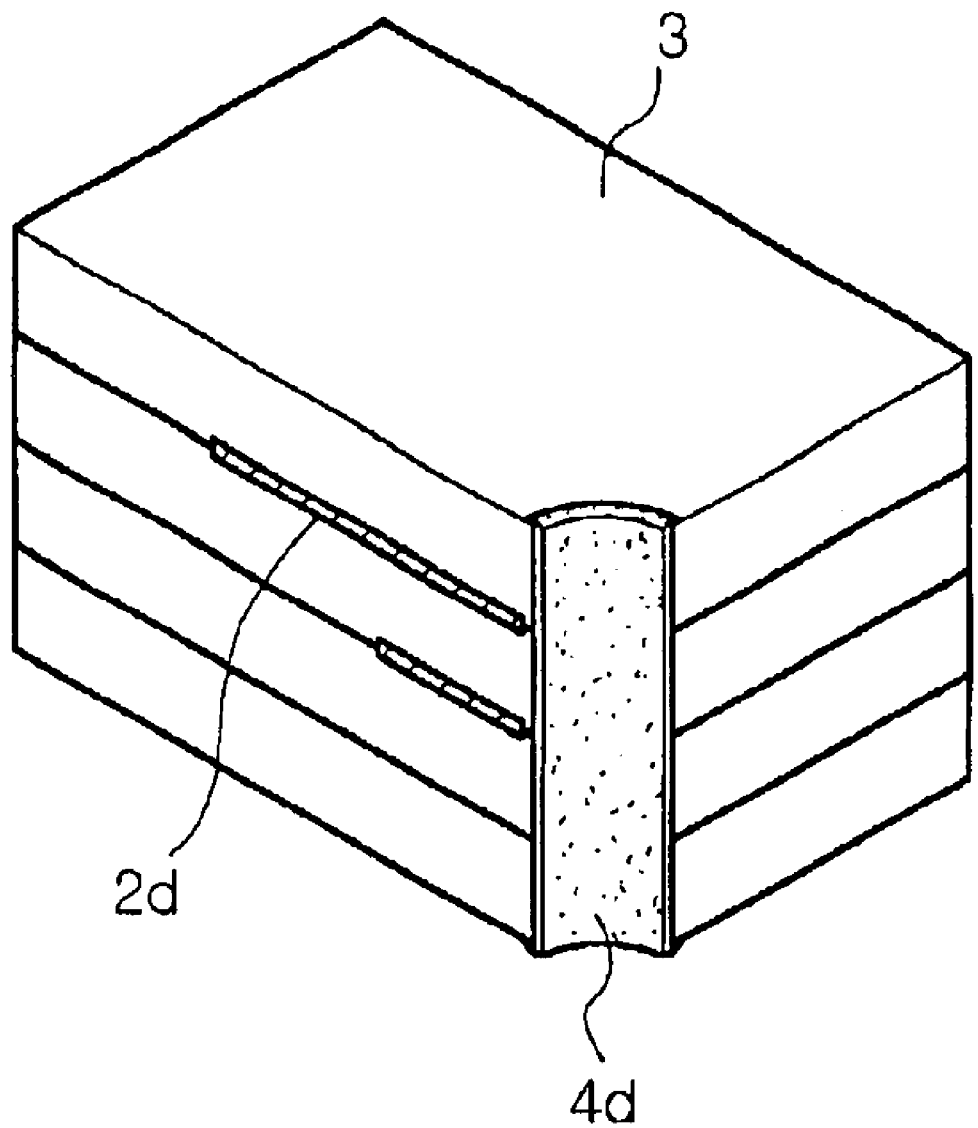
FIG. 7 is a perspective view showing a multilayer substrate comprising an external terminal formed by yet another conventional method.
Figure 8:
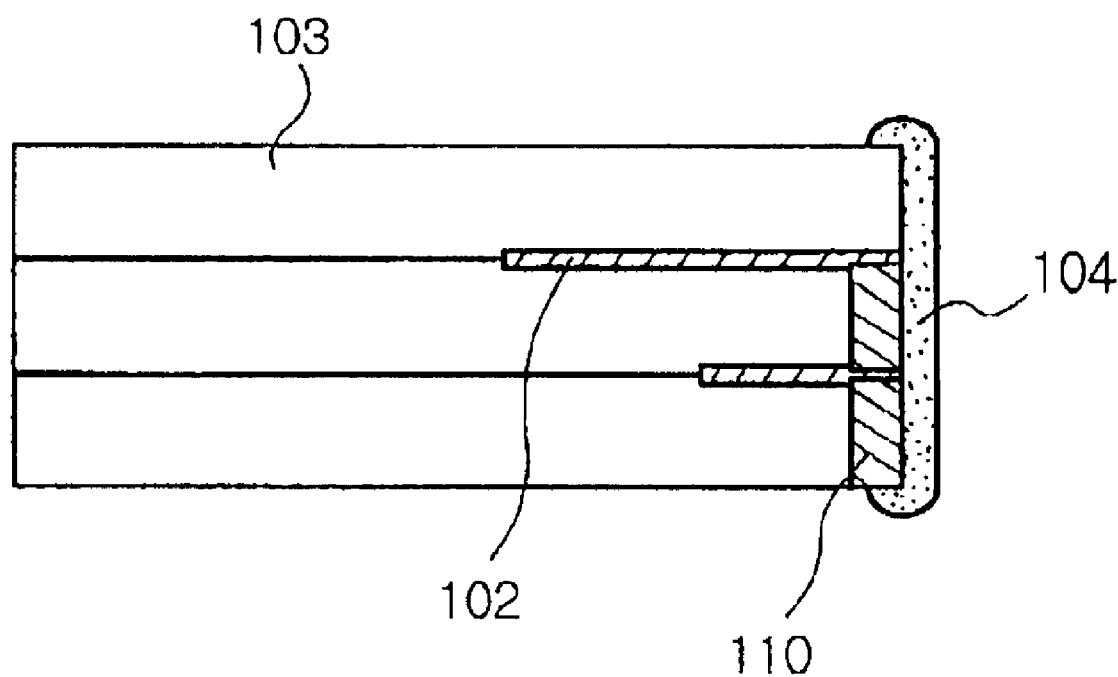
FIG. 8 is a cross-sectional view of a multilayer substrate in accordance with the present invention.
Figure 9:
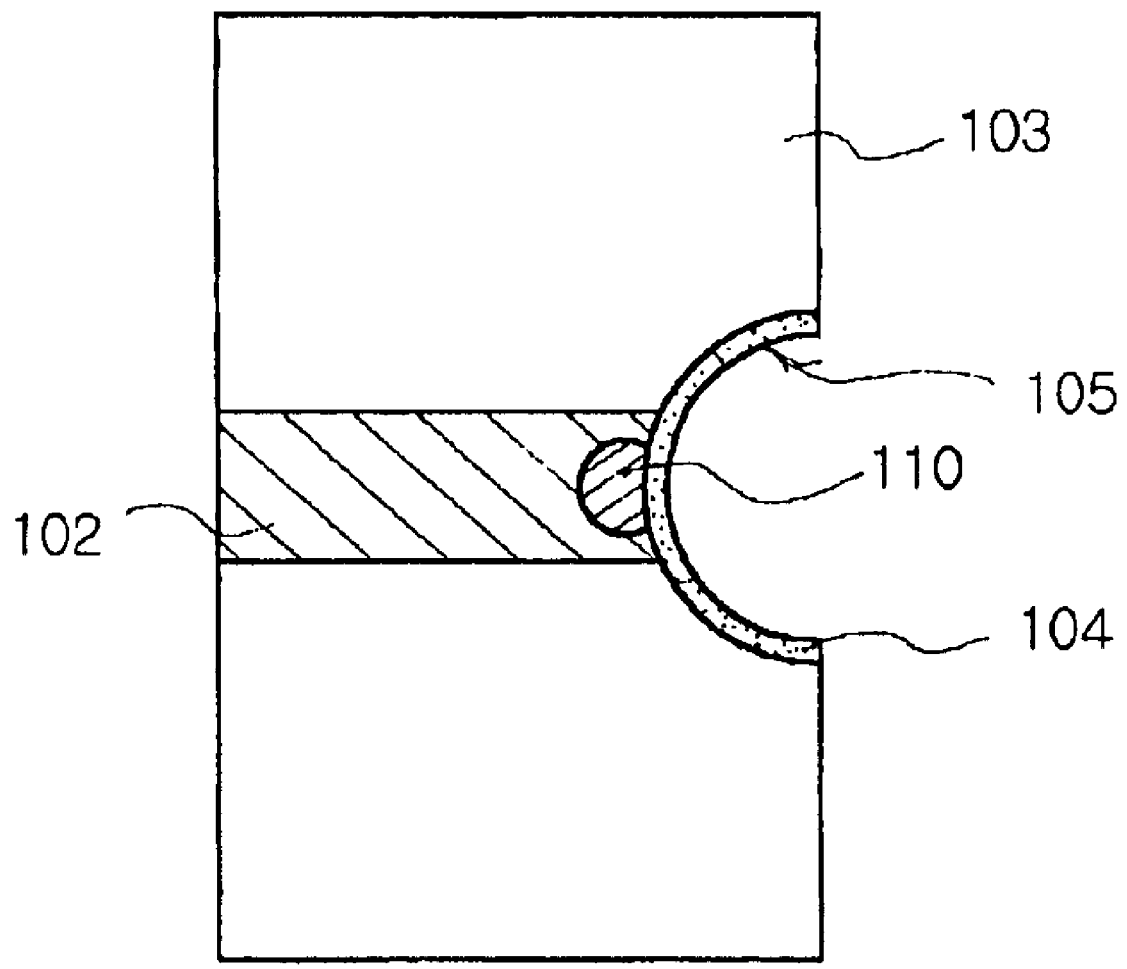
FIG. 9 is a plan view of a ceramic sheet of the multilayer substrate in accordance with the present invention.
Figure 10:
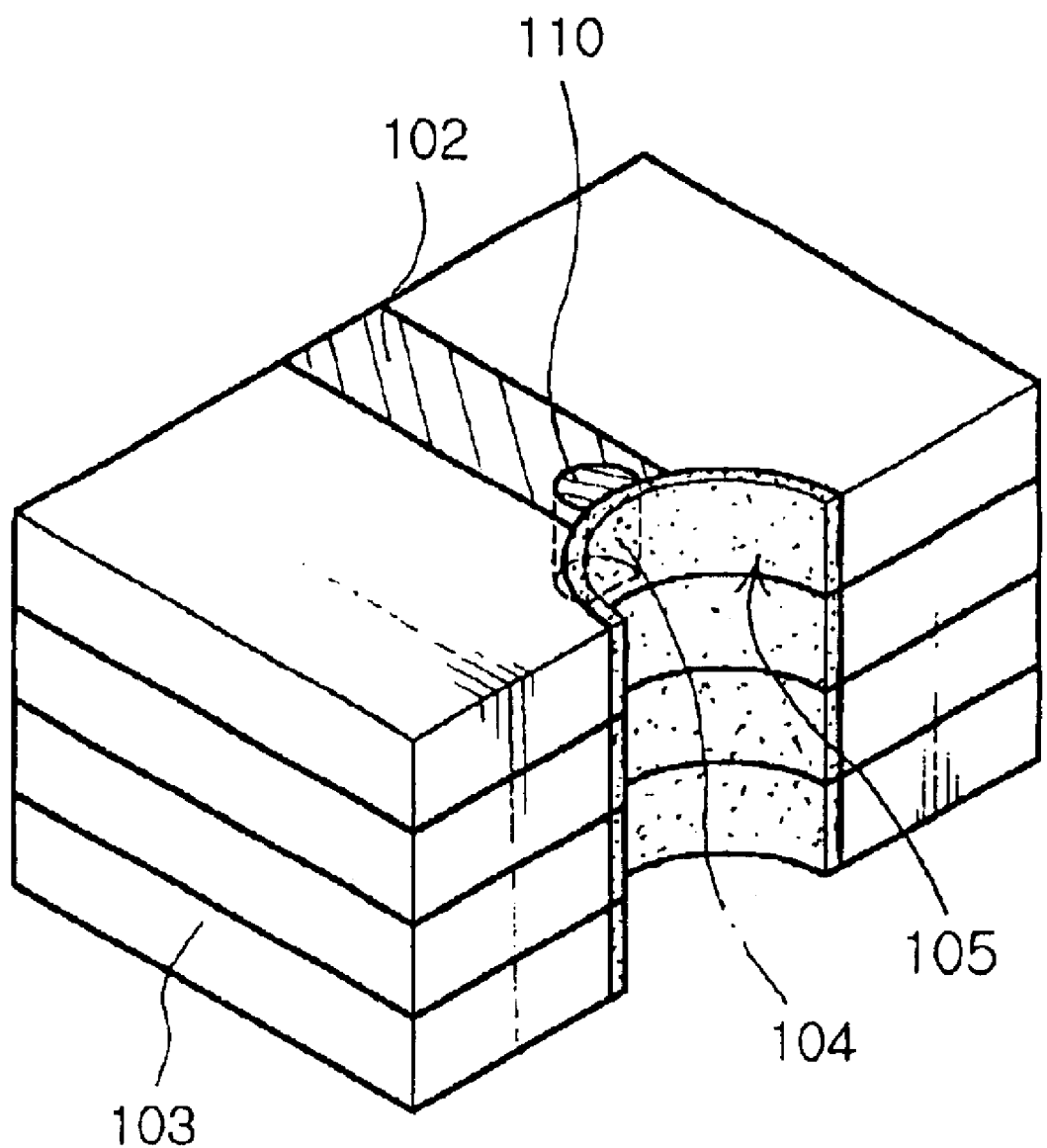
FIG. 10 is a perspective view of the multilayer substrate of FIG. 8.

Now, preferred embodiments of the present invention will be described in detail with reference to the annexed drawings. FIG. 8 is a cross-sectional view of a multilayer substrate in accordance with the present invention, and FIG. 9 is a plan view of a ceramic sheet of the multilayer substrate in accordance with the present invention. FIG. 10 is a perspective view of the multilayer substrate of FIG. 8.

As shown in FIGS. 8 and 9, pattern layers 102 for designated patterns are formed on respective ceramic sheets 103. An end of a pattern layer 102 is extended to an edge of a ceramic sheet 103 so as to exchange signals with the outside. It is not necessary to form the signal exchangeable patterns on all the ceramic sheets 103. That is, the signal exchangeable pattern may not be formed on some of the ceramic sheets 103.

The present invention employs the ceramic substrate 103 provided with a notch 105 being semicircular in shape. The notch 105 provides a space for forming an external electrode 104 therein. Further, in the case that a stack structure is formed by stacking a plurality of the ceramic sheets 103, through holes are formed through the stack structure before the stack structure is cut into a plurality of ceramic multilayer substrates so that the external electrodes and notches 105 can be simply formed. The through hole being circular in shape is formed through two neighboring sheets 103, and then is changed into notches 105 of semicircular shape so as to be opened to the outside when the stack structure is cut into the plural multilayer substrates.

A connection bar 110 is formed in the ceramic sheets 103 by filling a via hole located between the pattern layer 102 and the notch 105. One side of the connection bar 110 contacts the notch 105 so as to be exposed at an inner surface of the notch 105, and the other side of the connection bar 110 contacts the pattern layer 102. Differently from the pattern layer 102, the connection bar 110 is vertically formed through the ceramic sheets 103, and directly contacts the external electrode 104. The external electrode 104 is formed on the inner wall of the through hole 105, and connected to the pattern layer 102 and the connection bar 110, thereby serving to exchange external signals with the internal patterns.

FIG. 10 shows the multilayer substrate using the connection bars 110 of the present invention, in which the external electrode 104 is connected to both the internal pattern layers 102 and the connection bars 110.

The pattern layer 102 is made of a metallic deposition film, and the connection bar 110 is formed by filling the via hole (not shown) with metallic conductor so as to be electrically connected to the pattern layer 102. Preferably, the connection bar 110 is cylindrical in shape. However, the connection bar 110 may be formed in various shapes so as to be exposed at the wall surface of the notch 105.

Preferably, the outer circumference of the notch 105 passes through the center of the connection bar 110, and a diameter of the connection bar 110 is smaller than a width of the pattern layer 102. Since the connection bar 110 is vertically formed through the substrate 103, the via hole having a large diameter reduces a strength of the substrate 103 and increases an amount of the metallic conductor filling the via hole, thereby increasing the production cost. Also, it becomes difficult to easily and swiftly produce the substrate 103. In order to solve above problems, it is preferable to form the via hole within an area of the pattern layer 102.

As described above, in case the external electrode 104 is electrically connected to the pattern layer 102 by the connection bar 110, a degree of the electrical connection between the external electrode 104 and the internal pattern layer 102 is improved. Conventionally, since the pattern layer is formed only on the upper surface of each sheet, the connection between the external terminal and the internal patterns is achieved by a line contact. On the other hand, in the present invention comprising the connection bars, since a contact area between the internal patterns and the external terminal is increased and the connection between the connection bar and the external terminal is obtained by an area contact, the degree of the connection between the internal patterns and the external terminal is improved.

Further, compared to the conventional case, the formation of the connection bar improves a process for manufacturing the multilayer substrate. Hereinafter, along with the description of the improved effect of the process, a method for manufacturing a multilayer substrate by stacking a plurality of ceramic sheets in accordance with a first embodiment of the present invention will be described in detail with reference to FIGS. 12A to 12G.

A) A ceramic sheet 203 with a designated thickness is prepared.

B) A pattern layer 202 for forming a circuit element is formed on the ceramic substrate 203. The plural pattern layer 202 cooperates with other pattern layers (not shown) on vertically stacked ceramic sheets to form various circuit elements. The pattern layer 202 is made of a metal deposition film.

C) Via holes 211 are formed within an end of the pattern layer 202 extended to an edge of the ceramic substrate 203 so as to exchange signals with the outside. The via hole 211 is vertically formed in the ceramic substrate 203 adjacent to the edge of the ceramic substrate 203. Preferably, a diameter of the via hole 211 is a little smaller than a width of the pattern layer 202. The via hole 211 is formed in only a part of the pattern layer 202 extended to the edge of the ceramic sheet 203 so as to exchange signals with the outside, and other via holes (not shown) are formed so as to exchange signals with other internal patterns of the ceramic sheet 203. Since the via holes 211 are formed simultaneously with other via holes for connecting the patterns formed on the upper and lower surface of the ceramic sheet 203 to each other, the via hole 211 is simply formed without increasing the number of manufacturing steps. Preferably, the via hole 211 has the same diameter as those of the via holes for connecting the patterns formed on the upper and lower surfaces of the ceramic substrate 203 to each other.

D) The via hole 211 is filled with a material for being electrically connected to the exposed pattern layer 202, thereby forming a connection bar 210. The connection bar 210 is made of metallic conductor so as to be electrically connected to the pattern layer 202.

E) A plurality of ceramic sheets 203 formed by the aforementioned steps are stacked vertically. Parts or all of the stacked ceramic sheets 203 each comprise the connection bar 210 formed by filling the via hole 211, and the connection bar 210 is connected to the internal patterns of the corresponding ceramic sheet 203.

F) A notch 205 is vertically formed on the edge of the stacked ceramic sheets 203 so as to expose the pattern layers 202 and the connection bar 210. The notch 205 is semicircular in shape so as to be opened to the outside, and passes through the connection bar 210. That is, the connection bar 210 is exposed in the inner wall of the notch 205. Preferably, the outer circumference of the notch 205 passes through the center of the connection bar 210.

G) An external terminal 204 is formed on an inner circumference of the notch 205. The external terminal 204 is formed by depositing a metal on the inner circumference of the notch 205, and is connected to the pattern layers 202 and the connection bars 210.

Since the notch is formed through the stack structure formed by stacking the plural ceramic sheets, the above-described manufacturing method in accordance with the first embodiment uniformly forms the external electrode. Further, since the metallic connection bar is formed on the pattern layer connected to the outside, the connection bar is still exposed to the outside even if shear stress is generated in the punching process, thereby preventing a poor connection between the internal patterns and the external electrode due to the deformation of the ceramic substrate. Moreover, a large connection area between the internal patterns and the external electrode improves a degree of the connection therebetween.

The method for manufacturing a multilayer substrate of the present invention may be modified as follows. That is, in accordance with a second embodiment of the present invention, a step for forming a via hole is performed prior to a step for forming a pattern layer. FIGS. 13A to 13G illustrate a method for manufacturing a multilayer substrate in accordance with the second embodiment of the present invention.

A) A ceramic sheet 303 with a designated thickness is prepared.

B) Identically with the step C of the first embodiment, via holes 311 are formed in the ceramic sheet 303. A position of the via hole 311 is designated so that the via hole 311 is located within a pattern layer to be formed later. Of course, a suitable number of the via holes 311 may be formed to be located within the pattern layer for exchanging signals with the outside.

C) The via hole 311 is filled with metallic conductor, thereby forming connection bar 310. The same as the first embodiment, the connection bar 310 is vertically formed in the ceramic sheet 303.

D) A pattern layer 302 is formed on the ceramic sheet 303 so that the connection bar 310 is located within an area of the pattern layer 302.

E) to G) Identically with the first embodiment, a plurality of ceramic sheets 303 formed by the aforementioned steps are stacked vertically, a notch 305 is vertically formed on the edge of the stacked ceramic sheets 303, and an external terminal 304 is formed on an inner circumference of the notch 305.

The present invention further provides a method for manufacturing a multilayer substrate in which a bulk multilayer substrate is manufactured and then cut into a plurality of unit multilayer substrates, thereby performing a mass production of multilayer substrate products. This method is achieved by a third embodiment of the present invention and hereinafter, will be described in detail with reference to FIGS. 14A to 14H.

A) A bulk ceramic sheet 403 with a designated thickness is prepared. The ceramic sheet 403 is provided with scribe lines 408 so as to be cut into a plurality of unit ceramic substrates.

B) A plurality of same pattern layers 402 for forming circuit elements are formed on the ceramic sheet 403. The plural pattern layers 402 cooperate with pattern layers (not shown) on other bulk ceramic sheets to form various circuit elements. The pattern layers 402 are made of a metal deposition film.

C) Via holes 411 are formed within the pattern layers 402 extended to the scribe lines 408 of the ceramic sheet 403 so as to exchange signals with the outside. The via holes 211 are vertically formed on the ceramic sheet 403 adjacent to the scribe lines 408 of the ceramic sheet 403. Preferably, the diameter of the via holes 411 is a little smaller than the width of the pattern layers 402. The via holes 411 are selectively formed in some of the pattern layer 402 extended to the scribe lines 408 of the ceramic sheet 403 so as to exchange signals with the outside, and other via holes (not shown) are formed so as to exchange signals with other internal patterns on adjacent ceramic sheets 403. Since the via holes 411 are formed simultaneously with other via holes (not shown) for connecting the patterns formed on the upper and lower surface of the ceramic sheet 403 to each other, the via holes 411 are simply formed without increasing the number of manufacturing steps. Preferably, the via holes 411 have the same diameter as that of the via holes (not shown) for connecting the upper and lower patterns.

D) The via holes 411 are filled with a material for being electrically connected to the exposed pattern layers 402, thereby forming connection bars 410. The connection bars 410 are made of metallic conductor so as to be electrically connected to the pattern layers 402.

E) A plurality of the ceramic substrate sheets 403 formed by the aforementioned steps are stacked vertically. Parts or all of the stacked ceramic substrate sheets 403 comprise the connection bars 410 formed by filling the via holes 411, and the connection bars 410 are connected to the internal patterns of the corresponding ceramic sheet 403.

F) Through holes 405 are vertically formed on the scribe lines 408 of the stacked ceramic substrate sheets 403 so as to expose the pattern layers 402 and the connection bars 410. Each through hole 405 is cylindrical in shape, and passes through a corresponding connection bar 410. That is, the connection bar 410 is exposed in the inner wall of the through hole 405. Preferably, the outer circumference of the through hole 405 passes through the center of the connection bar 410.

G) External terminals 404 are formed on inner circumferences of the through holes 405. The external terminals 404 are formed by depositing a metal on the inner circumferences of the through holes 405, and are connected to the pattern layers 402 and the connection bars 410.

H) Stacked ceramic sheets 403 are cut along the scribe lines 408 into a plurality of ceramic multilayer substrates 400, each having a desired size.

Similarly with the first embodiment, since a through hole is formed in the stack structure formed by stacking the bulk ceramic sheets, this manufacturing method in accordance with the third embodiment uniformly forms the external electrode. Further, since the metallic connection bar is formed on the pattern layer connected to the outside, the connection bar is still exposed to the outside by shear stress generated in the punching process, thereby preventing a poor connection between the internal patterns and the external electrode due to the deformation of the ceramic substrate. Moreover, a large connection area between the internal patterns and the external electrode improves a degree of the connection therebetween. In addition, the manufacturing method of the third embodiment applies the steps for forming the connection bars and the through holes to a mass production of the multilayer substrates, thereby performing a mass production of a low temperature co-fired ceramic multilayer substrate products having the aforementioned effects.

Figure 15A:
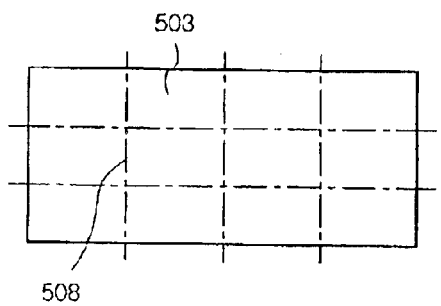
FIGS. 15A to 15H show a method for manufacturing a ceramic multilayer substrate in accordance with a fourth embodiment of the present invention.
Figure 15B:
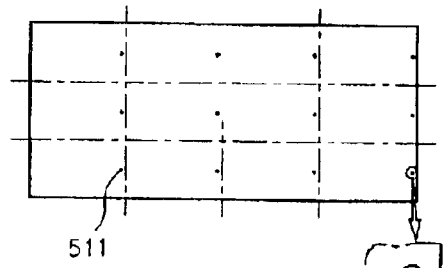
Figure 15C:
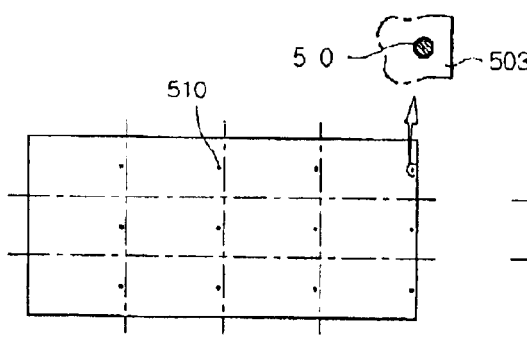
Figure 15D:
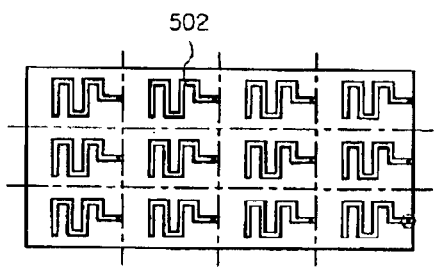
Figure 15E:
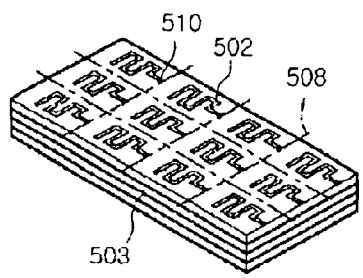
Figure 15F:
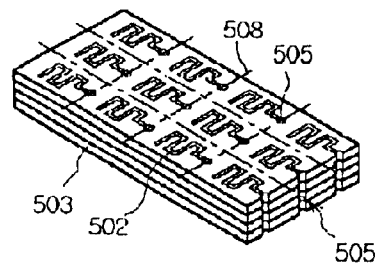
Figure 15G:
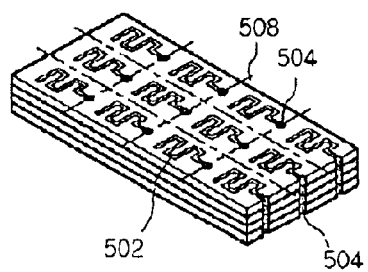
Figure 15H:
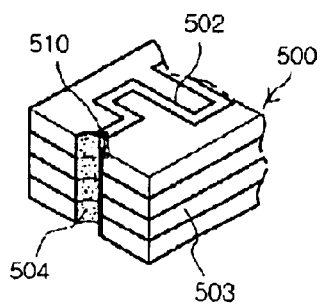

The method for manufacturing a multilayer substrate of the third embodiment may be modified as follows. That is, in accordance with a fourth embodiment of the present invention, a step for forming via holes is performed prior to a step for forming pattern layers. FIGS. 15A to 13H illustrate a method for manufacturing a multilayer substrate in accordance with the fourth embodiment of the present invention. Similarly with the second embodiment, in the manufacturing method of the fourth embodiment, connection bars are first formed, and then pattern layers are formed.

A) Identically with the third embodiment, a bulk ceramic sheet 503 with a designated thickness is prepared and provided with scribe lines 508 so as to be cut into a plurality of ceramic substrates.

B) Identically with the step C of the third embodiment, via holes 511 are formed in the ceramic sheet 503. Positions of the via holes 511 are designated so that the via holes 511 are located within pattern layers to be formed later, and the number of the via holes 511 is properly predetermined so that the via holes 511 are located within the pattern layers for exchanging signals with the outside.

C) The via holes 511 are filled with metallic conductor, thereby forming connection bars 510. The same as the third embodiment, the connection bars 510 are vertically formed in the ceramic sheet 503.

D) Pattern layers 502 are formed on the ceramic sheet 503 so that the connection bars 510 are located within areas of the pattern layers 502.

E) to G) Identically with the third embodiment, a plurality of ceramic sheets 503 formed by the aforementioned steps are stacked vertically, through holes 505 are vertically formed on the scribe lines 508 of the stacked ceramic sheets 503, and external terminals 504 are formed on inner circumferences of the through holes 505.

Figure 11:
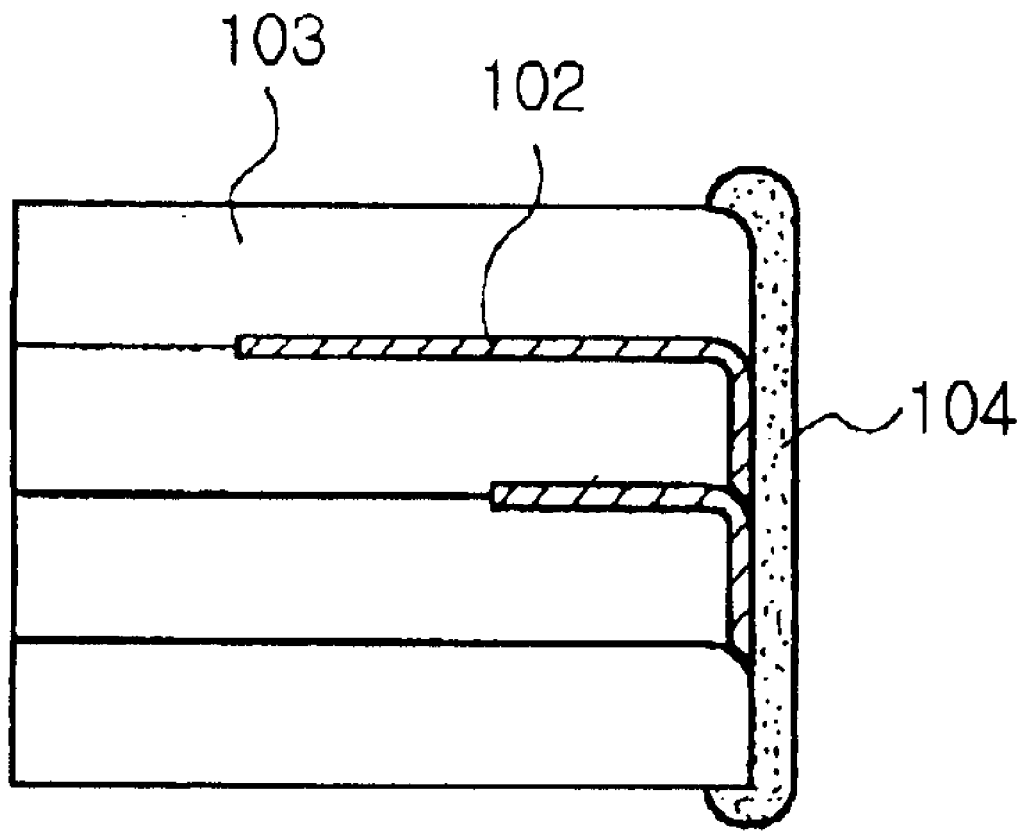
FIG. 11 is a cross-sectional view of the multilayer substrate in accordance with the present invention.
Figure 13C:
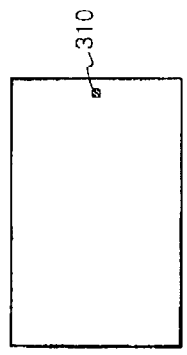
FIGS. 13A to 13G show a method for manufacturing a ceramic multilayer substrate in accordance with a second embodiment of the present invention.
Figure 13B:
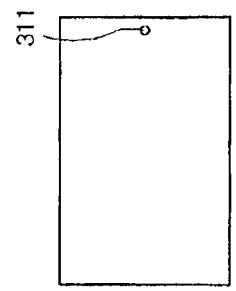
Figure 13A:
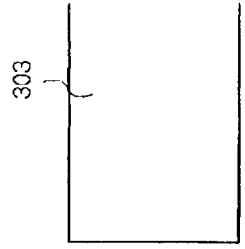
Figure 13F:
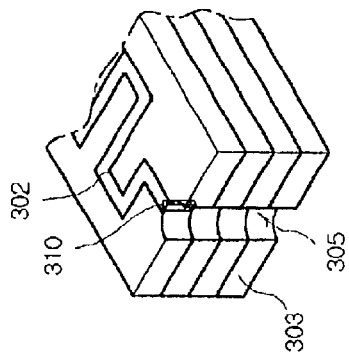
Figure 13E:
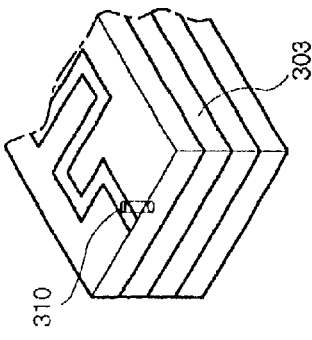
Figure 13D:
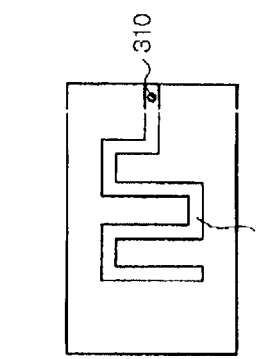
Figure 13G:
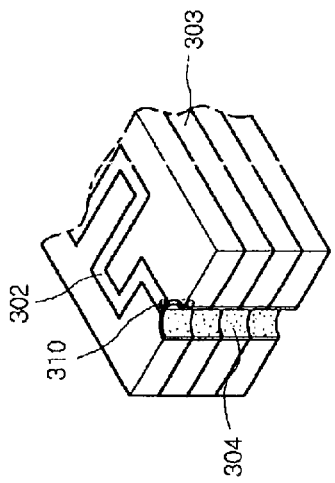
Figure 14A:
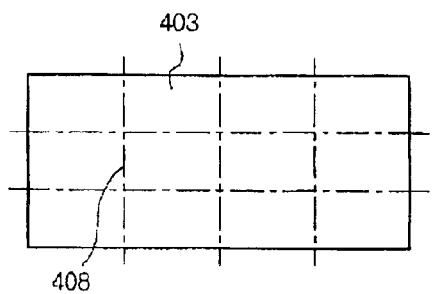
FIGS. 14A to 14H show a method for manufacturing a ceramic multilayer substrate in accordance with a third embodiment of the present invention.
Figure 14B:
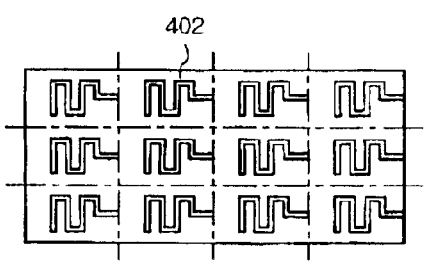
Figure 14C:
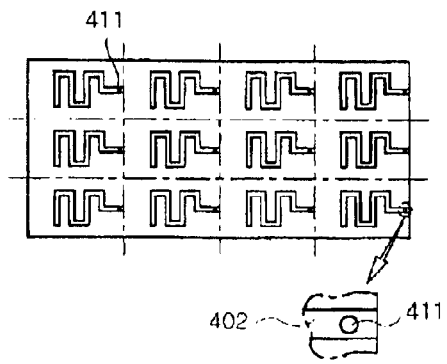
Figure 14D:
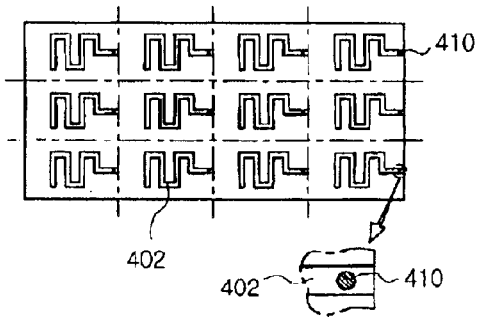
Figure 14E:
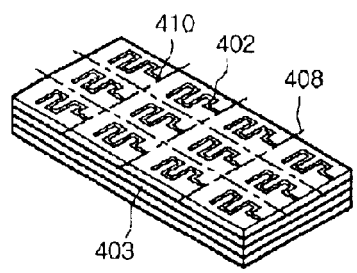
Figure 14F:
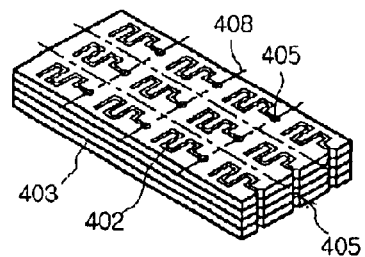
Figure 14G:
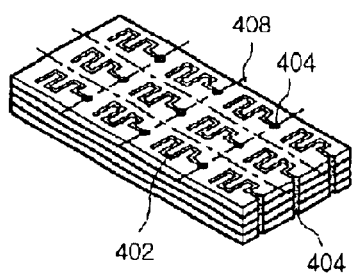
Figure 14H:
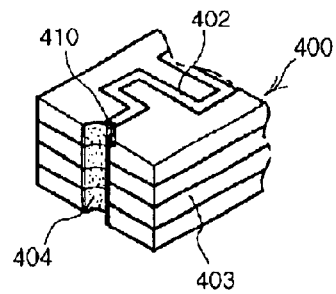

In accordance with the above-described embodiments of the present invention, multilayer substrates for stably maintaining the connection between the internal patterns and the external electrodes are manufactured. Conventionally, a process for forming a through hole after the stacking of the ceramic substrates was not used due to the aforementioned problems. However, as shown in FIG. 11, in accordance with a method for manufacturing multilayer substrates of the present invention, the connection bar 110 formed within the internal pattern layer 102 is still exposed in the wall of the through hole, thereby being connected to the external electrode 104 formed in the through hole. Further, the internal pattern layer 102 is connected to the connection bar 110, thereby being stably connected electrically to the external electrode 104.

As apparent from the above description, since a through hole is formed on the stack structure formed by stacking a plurality of sheets provided with pattern layers, the external electrode is uniformly formed in the ceramic multilayer substrate. Further, since a metallic connection bar is formed on the pattern layer connected to the outside, the connection bar is still exposed to the outside even if shear stress is generated in the step for punching the through hole, thereby preventing a poor connection between the internal patterns and the external electrode due to the deformation of the ceramic substrate. Moreover, a large connection area between the internal patterns and the external electrode improves a degree of the connection therebetween.

In addition, a method for manufacturing multilayer substrates of the present invention applies steps for forming the connection bars and the through holes to a mass production of the multilayer substrates, thereby performing a mass production of a low temperature co-fired ceramic multilayer substrate products having the aforementioned effects.

A low temperature co-fired ceramic multilayer substrate in accordance with the present invention connects the internal pattern layers to the external electrode via the connection bar formed on each ceramic sheet or layer, thereby improving the degree of the electrical connection between the internal pattern layers and the external electrode. Conventionally, since the pattern layer is formed only on the upper surface of the ceramic sheet, the connection between the external terminal and the internal patterns is achieved by a line contact. On the other hand, in the present invention comprising the connection bars, since a contact area between the internal patterns and the external terminal is increased and the connection between the connection bar and the external terminal is obtained by an area contact, the degree of the connection between the internal patterns and the external terminal is improved.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A ceramic multilayer substrate, comprising a plurality of stacked and fired ceramic sheets, said substrate further comprising:
    pattern layers formed on surfaces of at least one of the ceramic sheets to form designated circuit elements;
    at least one notch being formed on edges of the stacked ceramic sheets to be opened to the outside;
    at least one connection bar vertically formed in said at least one ceramic sheet having the pattern layers, the connection bar contacting the pattern layers; and
    at least one external terminal formed on the inner walls of said notch, electrically connected with the pattern layers, and directly contacting the connection bar, whereby the connection bar forms the electrical connection between the external terminal and the pattern layers.

2. The ceramic multilayer substrate as set forth in claim 1, wherein the pattern layers are made of a metal deposition film, and the connection bar is formed by filling at bast one via hole formed in said at least one ceramic sheet with metallic conductor so as to be electrically connected to the pattern layers.

3. The ceramic multilayer substrate as set forth in claim 1, wherein a circumference of the notch passes through the center of the connection bar.

4. The ceramic multilayer substrate as set forth in claim 1, wherein the pattern layer extended to the edge of the ceramic substrate has a width equal to or greater than the diameter of the connection bar.

5. The substrate of claim 1, wherein at least two of said external terminal, said pattern layers and said connection bar are made of different conductive materials.

6. A substrate, comprising:
    at least one material sheet having opposite upper and lower surfaces and at least a side surface extending in a thickness direction of said sheet between the upper and lower surfaces;
    a conductive pattern formed on the upper surface of said sheet;
    a conductive column extending in the thickness direction of said sheet and being in electrical contact with said conductive pattern; and
    an external electrode formed on the side surface of said sheet, said external electrode being in direct physical and electrical contact with said conductive column.

7. The substrate of claim 6, wherein the direct physical and electrical contact between said external electrode and said conductive column extends in said thickness direction over a distance greater than a thickness of said conductive pattern as measured in said thickness direction.

8. The substrate of claim 6, wherein said conductive column is in direct physical and electrical contact with said external electrode over an entire extent of said conductive column in said thickness direction.

9. The substrate of claim 8, wherein said conductive column extends through an entire thickness of said sheet.

10. The substrate of claim 6, further comprising a notch in said side surface, said external electrode being positioned on a wall of said notch.

11. The substrate of claim 10, wherein the wall of said notch is curved inwardly of said sheet and toward said conductive column.

12. The substrate of claim 11, wherein said conductive column is of a cylindrical shape having a portion cut out by the wall of said notch.

13. The substrate of claim 12, wherein the wall of said notch extends through a central axis of said conductive column.

14. The substrate of claim 6, wherein said external electrode is in direct physical and electrical contact with said conductive pattern in regions on opposite sides of said conductive column.

15. The substrate of claim 6, wherein said external electrode and said conductive column are made of different conductive materials.

16. The substrate of claim 6, wherein said external electrode and said conductive pattern are made of different conductive materials.

17. The substrate of claim 6, wherein said external electrode, said conductive pattern and said conductive pattern are made of three different conductive materials.

18. The substrate of claim 6, being a multilayer ceramic substrate and comprising a plurality of ceramic sheets stacked one upon another, said at least one material sheet being one of said ceramic sheets.

19. A multilayer substrate, comprising a plurality of material sheets stacked one upon another;
    each of said sheets having opposite upper and lower surfaces and a thickness direction between the upper and lower surfaces;
    at least one of said sheets including at least one conductive pattern formed on the upper surface thereof and a conductive column extending in the thickness direction and being in electrical contact with said conductive pattern;
    said substrate further comprising at least one through hole extending through said sheets, an inner wall of said through hole being plated with conductive material to define an external electrode common to said sheets, said external electrode being in direct physical and electrical contact with said conductive column of said at least one sheet.

20. The multilayer substrate of claim 19, wherein said at least one sheet includes
    multiple unconnected conductive patterns distributed on the upper surface of said at least one sheet,
    multiple conductive columns each extending in the thickness direction and being in electrical contact with one of said conductive patterns;
    said substrate further comprising multiple through holes extending through said sheets, an inner walls of each of said through holes being plated with conductive material to define an external electrode being in direct physical and electrical contact with one of said conductive columns of said at least one sheet.

21. The substrate of claim 19, wherein said conductive column is of a cylindrical shape having a portion cut out by a circular wall section of said through hole.

* * * * *